(12) United States Patent
Joshi et al.

(10) Patent No.: US 10,715,158 B1
(45) Date of Patent: Jul. 14, 2020

(54) PHASE-LOCKED LOOP (PLL) WITH CALIBRATION CIRCUIT

(71) Applicant: Synopsys, Inc., Mountain View, CA (US)

(72) Inventors: Akarsh Joshi, Bangalore (IN); Sharath Nadsar, Bengaluru (IN); Biman Chattopadhyay, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/424,365

(22) Filed: May 28, 2019

(30) Foreign Application Priority Data

Apr. 10, 2019 (IN) .............................. 201941014530

(51) Int. Cl.
*H03L 7/187* (2006.01)
*H03L 7/181* (2006.01)
*H03L 7/099* (2006.01)

(52) U.S. Cl.
CPC .............. *H03L 7/187* (2013.01); *H03L 7/099* (2013.01); *H03L 7/181* (2013.01)

(58) Field of Classification Search
CPC ...................................................... H03L 7/187
USPC ........................................................ 331/44
See application file for complete search history.

(56) References Cited

U.S. PATENT DOCUMENTS

| 7,772,930 | B2 | 8/2010 | Gatta |
| 8,432,229 | B2 | 4/2013 | Dong et al. |
| 8,508,308 | B2 | 8/2013 | Dong et al. |
| 9,287,825 | B2 | 3/2016 | Atesoglu |
| 2006/0140309 | A1* | 6/2006 | Kuo ......................... H03L 7/087 375/326 |
| 2008/0272851 | A1 | 11/2008 | Lin et al. |
| 2010/0073094 | A1* | 3/2010 | Hoang ....................... H03L 7/18 331/25 |
| 2011/0204937 | A1* | 8/2011 | Demirkan ............... H03L 7/087 327/157 |
| 2018/0254882 | A1* | 9/2018 | Bogdan ................. H03L 7/0995 |

OTHER PUBLICATIONS

Wu, T. et al., "Method for a constant loop bandwidth in LC-VCO PLL frequency synthesizers," IEEE Journal of Solid-State Circuits, 2009, vol. 44, No. 2, pp. 427-435.

* cited by examiner

*Primary Examiner* — Joseph Chang
(74) *Attorney, Agent, or Firm* — Fenwick & West LLP

(57) ABSTRACT

A phase-locked loop (PLL) for generating a VCO output signal at a target frequency has been disclosed. The PLL includes at least first and second VCOs, first and second multiplexers, and a frequency divider. The first and second VCOs generate first and second output signals over first and second frequency ranges, respectively. The first multiplexer receives the first and second output signals from the first and second VCOs, respectively, and outputs the first output signal when the target frequency is in the first frequency range and the second output signal when the target frequency is in the second frequency range or less than the first frequency range. The frequency divider divides a frequency of the second output signal by a division factor to generate a third output signal. The second multiplexer outputs one of the first, second, and third output signals as the VCO output signal.

20 Claims, 7 Drawing Sheets

PHASE-LOCKED LOOP (PLL) WITH CALIBRATION CIRCUIT

CROSS REFERENCE TO THE RELATED APPLICATION

This application claims the right of priority to India Provisional Application Serial No. 201941014530, entitled "Phase-Locked Loop (PLL) with Calibration Circuit", filed Apr. 10, 2019, which is incorporated by reference in its entirety.

FIELD

The present disclosure relates generally to electronic circuits, and more particularly, to a phase-locked loop (PLL) circuit.

BACKGROUND

Integrated circuits are widely used in communication systems for performing time-based operations and sequential operations. A phase-locked loop (PLL) is used to generate an oscillator (or an output) signal based on an input reference signal. The output signal has a phase that is directly related with a reference phase of the reference signal. PLLs are widely used in modern electronic systems such as radios, telecommunication systems, computers, and so forth. In communication systems, the PLLs are used to generate oscillator signals, which are used for modulation and demodulation of a message signal. The PLL includes a phase detector, a charge pump, a filter, and a voltage-controlled oscillator (VCO). The phase detector compares the phase of the output signal with the reference phase of the reference signal and generates a phase error signal. The charge pump receives the phase error signal and generates a corresponding current signal. The filter receives and smoothens the current signal and provides a voltage control signal to the VCO. The VCO generates the output signal having an output frequency that is proportional to a reference frequency of the reference signal.

Typically, the VCO is implemented using an inductive-capacitive (LC) VCO (LCVCO). The LCVCO includes a cross-coupled differential amplifier with an LC tank in the feedback path. The LC tank includes an inductor, a varactor, and switched capacitor banks. The switched capacitor banks extend the tuning range of the LCVCO. The precise control of the output frequency is important for overcoming jitters in the PLL.

Further, the PLL may include multiple VCOs, such as a low-frequency VCO (LFVCO), a medium-frequency VCO (MFVCO), and a high-frequency VCO (HFVCO), that are designed to operate in different frequency ranges and generate output signals in corresponding frequency ranges. In an example, the LCVCO may operate in a first frequency range (e.g., 2.7 GHz-3.7 GHz), the MFVCO may operate in a second frequency range (e.g., 3.7 GHz-4.7 GHz), and the HFVCO may operate in a third frequency range (e.g., 4.7 GHz-5.7 GHz). Such PLL can generate the output signal over a wide range of frequencies i.e., 2.7 GHz-5.7 GHz, by selecting one or a combination of the LFVCO, MFVCO, and HFVCO. However, certain applications may require an oscillator signal having a much lesser frequency, i.e., less than 2.7 GHz. In such cases, the PLL fails to generate the oscillator signal at such a lower frequency (e.g., less than 2.7 GHz).

Generally, for matching the output frequency with the desired frequency, the VCO (e.g., the LFVCO, MFVCO, or HFVCO) is required to be calibrated. The PLL uses a digital-to-analog converter (DAC) for calibrating the VCO such that the output frequency matches the desired frequency. A capacitive DAC is commonly used which calibrates the VCO based on a set of calibration bits such that the output frequency matches the desired frequency. However, achieving a wide frequency range using a single VCO is difficult because the capacitive DAC operates at a higher capacitance (i.e., lower oscillator frequency) and hence, the effective frequency steps decrease, thereby requiring significantly higher number of bits to implement lower frequencies. Further, it is difficult to implement a PLL having a wide-tuning range due to channel leakage and degradation. Further, the jitter level in the PLL increases due to the variations in process, voltage, and temperature (PVT). Therefore, the PLL, especially, the PLL with multiple VCOs is prone to degrade in performance due to the PVT variations. Further, the jitter results in timing errors in the integrated circuit that receives the output signal from the PLL. In certain scenarios, the PLL includes analog circuits for compensating the output frequency of the PLL due to the PVT variations. However, one disadvantage of such a PLL is the limited range of frequency that it can generate due to the additional analog circuits.

Further, in such an implementation of PLL with multiple VCOs, a frequency range of one VCO may overlap with a frequency range of the other VCO. Tuning the frequency impacts a gain factor of the corresponding VCO, thereby leading to suboptimal performance of the PLL. Compensating for changes in the VCO gain factor can be more complicated.

SUMMARY

In light of the foregoing, it would be advantageous to have a PLL that can operate over a wide range of frequencies without putting extra effort on the design of the VCO. Further, it would be advantageous to have a PLL with reduced channel leakage and degradation due to PVT variations, and in which timing errors due to the jitters are reduced as compared to the existing PLLs. Furthermore, a need exists for improved systems and methods that can compensate the variations in gain factor of VCOs.

In an embodiment of the present invention, a phase-locked loop (PLL) for generating a voltage-controlled oscillator (VCO) output signal at a target frequency is provided. The PLL includes first and second voltage-controlled oscillators (VCOs), first and second multiplexers, and a frequency divider. The first VCO generates a first output signal over a first frequency range. The second VCO generates a second output signal over a second frequency range. The first multiplexer receives the first output signal from the first VCO, and receive the second output signal from the second VCO. The first multiplexer further outputs the first output signal in response to the target frequency being in the first frequency range, and outputs the second output signal in response to the target frequency being in the second frequency range or below the first frequency range. The frequency divider receives the second output signal in response to the target frequency being below the first frequency range. The frequency divider divides a frequency of the second output signal by a division factor to generate a third output signal. The second multiplexer is configured to receive the one of the first output signal and second output signal from the first multiplexer, and receives the third output signal from the frequency divider. The second multiplexer outputs, as the VCO signal, one of the first output signal, second output signal, or third output signal based on the target frequency. In particular, the second multiplexer outputs the first output signal as the VCO output signal when the target frequency is in the first frequency range, the second output signal as the VCO output signal when the target frequency is in the second frequency range, and the third output signal as the VCO output signal when the target frequency is below the first frequency range.

In another embodiment of the present invention, a method for generating a voltage-controlled oscillator (VCO) output signal at a target frequency is provided. A first VCO generates a first output signal over a first frequency range, and a second VCO generates a second output signal over a second frequency range by a second VCO. The target frequency is compared to the first frequency range and the second frequency range. A first multiplexer selects one of the first output signal or the second output signal. The first output signal is selected when the target frequency is in the first frequency range, and the second output signal is selected when the target frequency is in the second frequency range or is below the first frequency range. A frequency divider divides a frequency of the second output signal by a division factor to generate a third output signal when the target frequency is below the first frequency range. A second multiplexer outputs one of the first output signal, second output signal, or third output signal as the VCO output signal, based on the target frequency. The second multiplexer selects the first output signal as the VCO output signal when the target frequency is in the first frequency range, the second output signal as the VCO output signal when the target frequency is in the second frequency range, and the third output signal as the VCO output signal when the target frequency is below the first frequency range.

Various embodiments of the present invention provide PLL and a method for generating a VCO output signal at a target frequency. The PLL includes first and second VCOs that generate first and second output signals over first and second frequency ranges, respectively. The first frequency range is lesser than the second frequency range. A first multiplexer outputs the first output signal when the target frequency is in the first frequency range and the second output signal when the target frequency is in the second frequency range or is below the first frequency range. A frequency divider receives the second output signal when the target frequency is below the first frequency range. The frequency divider divides a frequency of the second output signal by a division factor to generate a third output signal when the target frequency is below the first frequency range. A second multiplexer further outputs the first output signal as the VCO output signal when the target frequency is in the first frequency range, the second output signal as the VCO output signal when the target frequency is in the second frequency range, and the third output signal as the VCO output signal when the target frequency is below the first frequency range. Based on the comparison of a first count corresponding to a number of cycles of the VCO output signal with a second count corresponding to the number of cycles of the target frequency, the calibration module generates first, second, and third sets of coarse and fine calibration bits. The calibration module provides one of the first, second, and third sets of coarse and fine calibration bits to one of the first and second VCOs for calibrating the frequency of the VCO output signal with the target frequency. Such automatic calibration of the VCOs generates and provides a frequency locking range (FLR) of 2:1 (i.e., a ratio of the maximum to minimum frequency is 2:1) despite variations in process, voltage, and temperature (PVT) of the PLL.

Further, to encounter losses introduced by the internal components of the VCOs during calibration, a current control module is included in the PLL for generating and providing a tank current to an inductive-capacitive (LC) tank of at least one of the plurality of VCOs. The generation of the tank current is controlled based on one of the first, second, and third sets of coarse calibration bits. The current control module further controls first and second conductance of first and second amplifiers, respectively, of a cross-coupled pair of amplifiers of at least one of the plurality of VCOs, by increasing the tank current through the LC tank. Thus, by means of controlling the first and second conductance of the first and second amplifiers, the internal losses of the VCOs are minimized, thereby ensuring smooth and efficient operation of the VCOs. Further, variation in gain factors of the first and second VCOs is controlled based on a charge pump current code, thereby obtaining a constant loop bandwidth over a wide FLR which is preferable for low jitter applications of the PLL.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

As used in the specification and claims, the singular forms "a", "an", and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of components which constitutes a PLL for generating a VCO output signal at a target frequency. Accordingly, the components and the method steps have been represented, showing only specific details that are pertinent for an understanding of the present invention so as not to obscure the disclosure with details that will be readily apparent to those with ordinary skill in the art having the benefit of the description herein.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1:
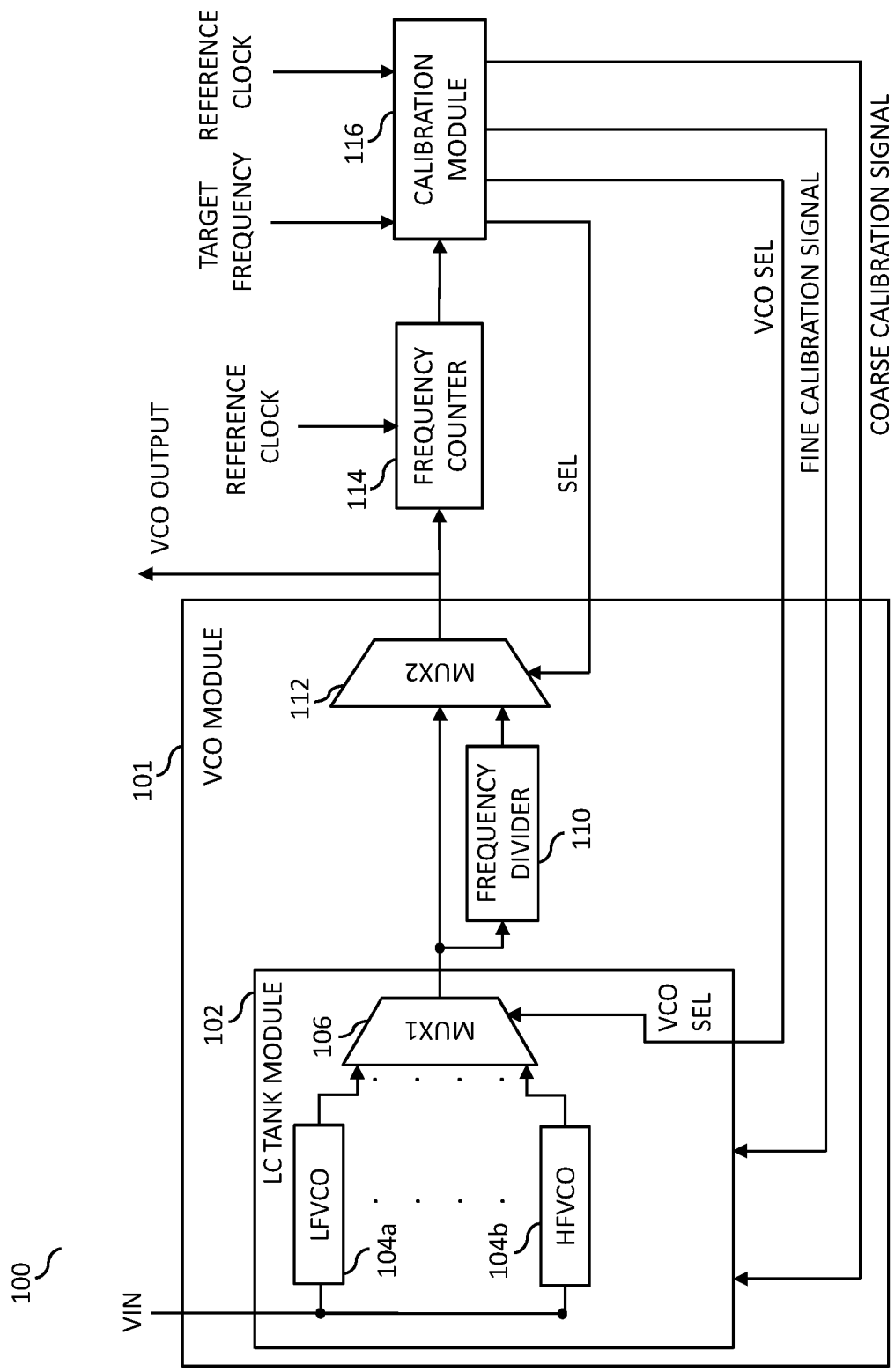
FIG. 1 is a schematic block diagram of a frequency calibration and generation unit for generating a VCO output signal at a target frequency, in accordance with an embodiment of the present invention.

Referring now to FIG. 1, a schematic block diagram of a frequency calibration and generation unit 100 for generating a VCO output signal at a target frequency in accordance with an embodiment of the present invention is shown. The frequency calibration and generation unit 100 includes a VCO module 101, which outputs an oscillator signal, labelled VCO OUTPUT in FIG. 1. The frequency calibration and generation unit 100 also includes a frequency counter 114 and a calibration module 116. The frequency calibration and generation unit 100 is used in a phase-locked loop (PLL) circuit (described later in conjunction with FIG. 4) for generating oscillator signals at different target frequencies.

The VCO module 101 includes an inductive-capacitive (LC) tank module 102.

The LC tank module 102 includes a plurality of VCOs including at least first and second VCOs 104a and 104b. The LC tank module 102 further includes a first multiplexer (MUX1) 106 and a plurality of digital-to-analog converters (DACs) including at least a coarse DAC and a fine DAC (not shown in FIG. 1), such as the coarse DACs 214 and fine DACs 216 shown in FIG. 2. The LC tank module 102 may further include one or more current control modules (not shown in FIG. 1), such as the current control module 202 described with respect to FIGS. 2 and 3. The VCO module 101 further includes a first frequency divider 110 and a second multiplexer (MUX2) 112. The VCO module 101 is connected to the frequency counter 114 and the calibration module 116, as shown.

Figure 2:
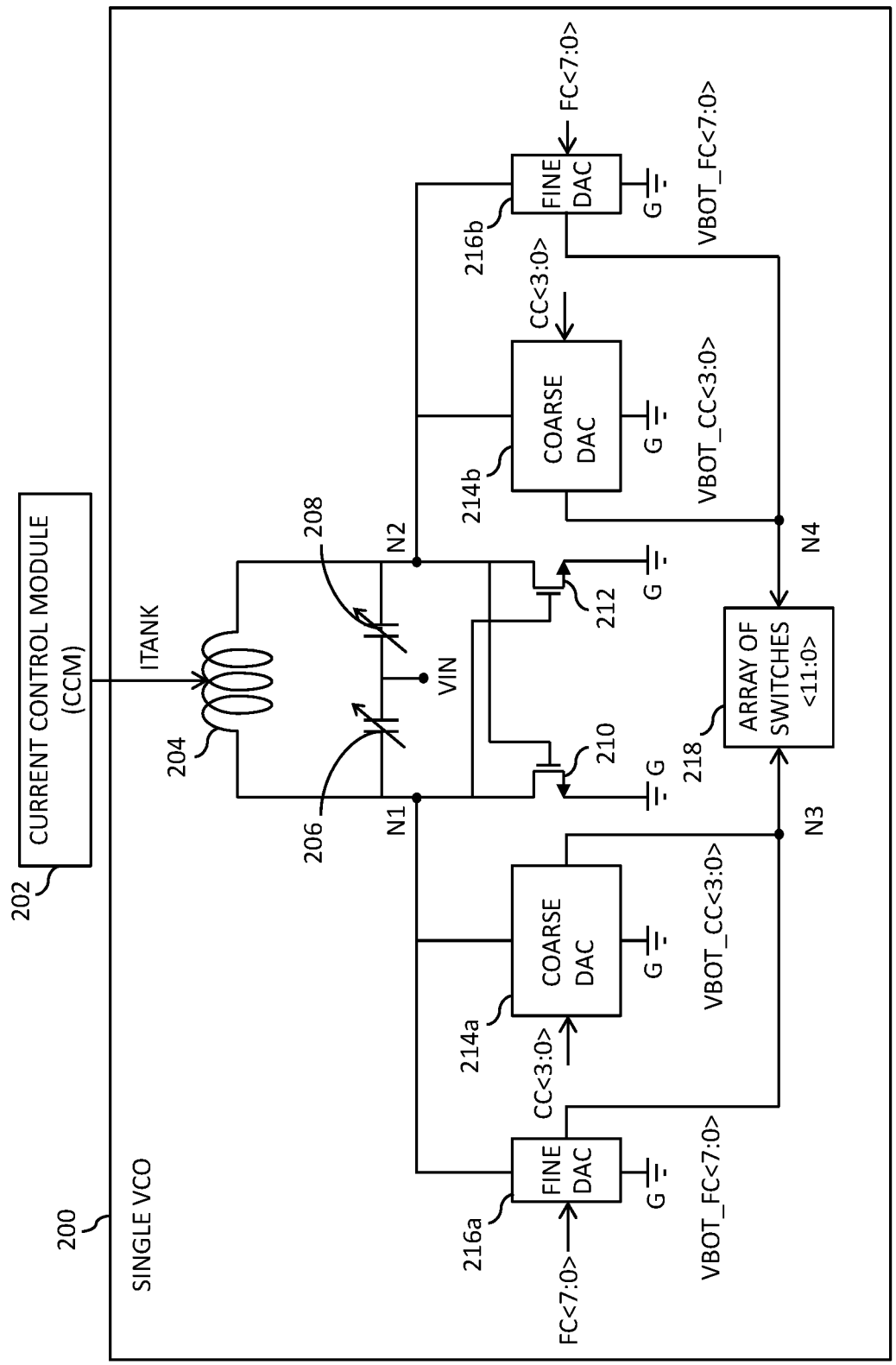
FIG. 2 is a schematic block diagram of an exemplary VCO of FIG. 1 and a current control module, in accordance with an embodiment of the present invention.

The first VCO 104a includes a low-frequency, inductive-capacitive VCO (LCVCO), and the second VCO 104b includes a high-frequency LCVCO. The first VCO 104a is referred to as a low-frequency VCO (LFVCO), and the second VCO 104b is referred to as a high-frequency VCO (HFVCO). The first and second VCOs 104a and 104b have input terminals connected to an external circuit (not shown) for receiving an input voltage signal (VIN). The external circuit may be a low-pass filter circuit of the PLL that uses the VCO module 101, which has been described later in conjunction with FIG. 4. The first and second VCOs 104a and 104b generate first and second output signals over first and second frequency ranges, respectively. In an embodiment, the first frequency range is less than the second frequency range. For example, a frequency range of the low-frequency LCVCO may be between 2.7 GHz and 3.7 GHz, which is less than a frequency range of the high-frequency LCVCO that may be between 4.7 GHz and 5.7 GHz. The first and second VCOs 104a and 104b have output terminals that are connected to the first multiplexer (MUX1) 106. Each VCO 104 may include one or more DACs, e.g., a course DAC and fine DAC. The VCOs 104 may be implemented as differential VCOs with a pair of coarse DAC and a pair of fine DACs, as shown in FIG. 2.

A person having ordinary skill in the art will understand that the scope of the disclosed invention is not limited to using two VCOs i.e., the first VCO 104a (e.g., the low-frequency LCVCO) and the second VCO 104b (e.g., the high-frequency LCVCO). The LC tank module 102 may include more than two VCOs, for example, a third VCO (not shown). The third VCO may be a medium-frequency LCVCO having a frequency range that may be greater than the frequency range of the first VCO 104a but lesser than the frequency range of the second VCO 104b. In an example, the frequency range of the low-frequency LCVCO may be between 2.7 GHz and 3.7 GHz, the frequency range of the medium-frequency LCVCO may be between 3.7 GHz and 4.7 GHz, and the frequency range of the high-frequency LCVCO may be between 4.7 GHz and 5.7 GHz.

The first multiplexer 106 has input terminals connected to the output terminals of the first and second VCOs 104a and 104b for receiving the first and second output signals, respectively. If the VCO module 101 has additional VCOs, the first multiplexer 106 has an input for each VCO. The first multiplexer 106 further includes a select terminal for receiving a VCO select signal (VCO SEL) from the calibration module 116. The first multiplexer 106 has an output terminal for outputting one of the VCO output signals (e.g., one of the first or second output signals) based on the VCO select signal (VCO SEL). In the two VCO example, the first multiplexer 106 outputs the first output signal based on the VCO select signal (VCO SEL) that indicates a selection of the first VCO 104a when the target frequency is in the first frequency range. Similarly, the first multiplexer 106 outputs the second output signal based on the VCO select signal (VCO SEL) that indicates the selection of the second VCO 104b when the target frequency is in the second frequency range or the target frequency is below the first frequency range. The output terminal of the first multiplexer 106 is connected to the first frequency divider 110 and the second multiplexer 112.

The first frequency divider 110 is connected to the first multiplexer 106 for receiving the second output signal when the target frequency is below the first frequency range. The first frequency divider 110 divides a frequency of the second output signal to generate a third output signal when the target frequency is below the first frequency range. For example, the first frequency divider 110 divides the frequency of the second output signal by a first division factor (for example, "2") to generate the third output signal.

The second multiplexer 112 has a first input terminal connected to the output terminal of the first multiplexer 106 for receiving at least one of the first and second output signals. For example, the second multiplexer 112 receives the first output signal from the first multiplexer 106 when the target frequency is in the first frequency range. Similarly, the second multiplexer 112 receives the second output signal from the first multiplexer 106 when the target frequency is in the second frequency range. The second multiplexer 112 further includes a second input terminal connected to the first frequency divider 110 for receiving the third output signal. For example, the second multiplexer 112 receives the third output signal from the first frequency divider 110 when the target frequency is below the first frequency range. The second multiplexer 112 further includes a select terminal for receiving a SEL signal from the calibration module 116. The second multiplexer 112 further includes an output terminal for outputting one of the first, second, and third output signals based on the SEL signal. The second multiplexer 112 outputs the first output signal as the VCO output signal (VCO OUTPUT) based on the SEL signal when the target frequency is in the first frequency range. Similarly, the second multiplexer 112 outputs the second output signal as the VCO output signal (VCO OUTPUT) based on the SEL signal when the target frequency is in the second frequency range. Further, the second multiplexer 112 outputs the third output signal as the VCO output signal (VCO OUTPUT) based on the SEL signal when the target frequency is below the first frequency range. The output terminal of the second multiplexer 112 is connected to the frequency counter 114.

The frequency counter 114 is connected to the output terminal of the second multiplexer 112 for receiving the VCO output signal. The frequency counter 114 further receives a reference clock signal from a reference clock source (not shown). Based on the reference clock signal, the frequency counter 114 generates a first count corresponding to a number of cycles of the VCO output signal. The frequency counter 114 provides the first count to the calibration module 116.

The calibration module 116 is connected to the frequency counter 114 for receiving the first count. The calibration module 116 further receives a target signal having the target frequency, and the reference clock signal. The calibration module 116 may receive the target signal having the target frequency from an external circuit (not shown). Based on the target frequency and the reference clock signal, the calibration module 116 generates a second count corresponding to a number of cycles of the target frequency. Further, the calibration module 116 compares the first and second counts and generates the VCO select signal (VCO SEL). The calibration module 116 may compare the target frequency with at least one of the first and second frequency ranges of the first and second VCOs 104a and 104b, respectively, for generating the VCO select signal (VCO SEL).

Further, the calibration module 116 is connected to the select terminals of the first and second multiplexers 106 and 112, and the first and second VCOs 104a and 104b of the LC tank module 102. The calibration module 116 provides the VCO select signal (VCO SEL) to the first multiplexer 106 for selecting one of the first and second output signals from the first and second VCOs 104a and 104b, respectively. In an example, if the target frequency is in the first frequency range, then the calibration module 116 may generate the VCO select signal (VCO SEL) for selecting the first output signal generated by the first VCO 104a. Similarly, if the target frequency is in the second frequency range, then the calibration module 116 may generate the VCO select signal (VCO SEL) for selecting the second output signal generated by the second VCO 104b. Similarly, if the target frequency is below the first frequency range, then the calibration module 116 may generate the VCO select signal (VCO SEL) for selecting the second output signal generated by the second VCO 104b. Further, based on the comparison of the first count with the second count, the calibration module 116 generates the SEL signal, and provides the SEL signal to the second multiplexer 112 for selecting one of the second and third output signals.

When the first VCO 104a is selected, the calibration module 116 further generates and provides a coarse calibration signal and a fine calibration signal (e.g., a first set of coarse and fine calibration bits) to coarse and fine DACs of the first VCO 104a for calibrating the first VCO 104a. The first VCO 104a may be calibrated to obtain a frequency of the VCO output signal (i.e., the first output signal) that matches the target frequency when the target frequency is in the first frequency range. Similarly, when the second VCO 104b is selected, the calibration module 116 generates and provides a second set of coarse and fine calibration bits to the coarse and fine DACs of the second VCO 104b for calibrating the second VCO 104b such that the frequency of the VCO output signal (i.e., the second output signal) matches the target frequency when the target frequency is in the second frequency range. Similarly, the calibration module 116 generates and provides a third set of coarse and fine calibration bits to the coarse and fine DACs of the second VCO 104b for calibrating the second VCO 104b such that the frequency of the VCO output signal (i.e., the second output signal) matches the target frequency when the target frequency is below the first frequency range. The calibration module 116 may provide a single coarse calibration signal to all VCOs 104, and a single fine calibration signal to all VCOs 104. Because only one active VCO is selected by the first multiplexer 106 at a time, the calibration signals effectively calibrate only the active VCO. In other words, the coarse and fine calibration signals includes one of the first set of coarse and fine calibration bits, the second set of coarse and fine calibration bits, or the third set of coarse and fine calibration bits, depending on which VCO 104 is currently selected by the calibration module 116.

In an exemplary embodiment, when the target frequency (e.g., 2.5 GHz) is below the first frequency range (e.g., 2.7 GHz-3.7 GHz), the calibration module 116 generates and provides the VCO select signal (VCO SEL) to the first multiplexer 106 for selecting the second VCO 104b (e.g., the HFVCO). The calibration module 116 further generates and provides the third set of coarse and fine calibration bits to the coarse and fine DACs of the second VCO 104b for calibrating the frequency of the VCO output signal (i.e., the second output signal) to obtain the target frequency. During coarse and fine calibration of the second VCO 104b, the second VCO 104b receives, in the coarse and fine calibration signals, the third set of coarse and fine calibration bits for calibrating the frequency of the VCO output signal with the target frequency. The coarse calibration may be initiated with a maximum coarse code value for generating the VCO output signal having a minimum frequency, which prevents damage to various components of the VCOs. During the initiation of the coarse calibration, an initial value of a coarse code is set to the maximum coarse code value, for example, "31". In response, the coarse DAC of the VCO 104b receives the third set of coarse calibration bits (corresponding to the initial coarse code value i.e., "31") from the calibration module 116 and the second VCO 104b generates the second output signal according to the third set of coarse calibration bits. The first frequency divider 110 generates the third output signal by dividing the frequency of the second output signal by the first division factor (for example, "2"). The calibration module 116 compares the first count (corresponding to the number of cycles per second of the third output signal) with the second count (corresponding to the number of cycles per second of the target frequency) to determine whether the frequency of the third output signal is greater than, equal to, or less than the target frequency. In case the frequency of the third output signal is less than the target frequency, the calibration module 116 decreases the initial coarse code value "31" by a first defined value, for example, "1". The calibration module 116 generates an updated third set of coarse calibration bits (corresponding to the decreased coarse code value i.e., "30"), and provides the updated third set of coarse calibration bits to the coarse DAC of the second VCO 104b for calibrating the second VCO 104b. The coarse calibration continues until the frequency of the third output signal is greater than or equal to the target frequency.

In case the frequency of the third output signal is greater than the target frequency, the calibration module 116 generates and provides the third set of fine calibration bits (corresponding to an initial value of a fine code that is set to a minimum fine code value, for example, "2") to the fine DAC of the second VCO 104b, and the second VCO 104b generates the second output signal according to the third set of fine calibration bits. The first frequency divider 110 generates the third output signal by dividing the frequency of the second output signal by the first division factor (for example, "2"). The calibration module 116 compares the first count with the second count to determine whether the frequency of the third output signal is greater than, equal to, or less than the target frequency. In case the frequency of the third output signal is greater than the target frequency, the calibration module 116 increases the initial fine code value "2" by a second defined value, for example, "1". The calibration module 116 generates an updated third set of fine calibration bits (corresponding to the increased fine code value i.e., "3"), and provides the updated third set of fine calibration bits to the fine DAC of the second VCO 104b to calibrate the second VCO 104b. The fine calibration continues until the frequency of the third output signal i.e., the VCO output signal equals (or approximately equals) the target frequency. For example, if the target frequency is between the frequencies provided by two fine code values, the calibration module 116 selects the closest frequency as the fine calibration value. Thus, by performing the coarse and fine calibration, the second VCO 104b generates the VCO output signal having the frequency equal to or very close to the target frequency when the target frequency is less than the first frequency range.

In an exemplary embodiment, when the target frequency (e.g., 3.1 GHz) is in the first frequency range (e.g., 2.7 GHz-3.7 GHz), the calibration module 116 generates and provides the VCO select signal (VCO SEL) to the first multiplexer 106 for selecting the first VCO 104a (e.g., the LFVCO). The calibration module 116 further generates and provides the first set of coarse and fine calibration bits to the coarse and fine DACs of the first VCO 104a for calibrating the frequency of the VCO output signal (i.e., the first output signal) to obtain the target frequency. During coarse and fine calibration of the first VCO 104a, the coarse and fine DACs provides the first set of coarse and fine calibration bits for calibrating the frequency of the VCO output signal with the target frequency. The coarse calibration may be initiated with a maximum coarse code value for generating the VCO output signal with a minimum frequency, which prevents damage to various components of the VCOs. Therefore, during the initiation of the coarse calibration, an initial value of a coarse code is set to the maximum coarse code value, for example, "31". In response, the coarse DAC of the first VCO 104a receives the first set of coarse calibration bits (corresponding to the initial coarse code value i.e., "31") from the calibration module 116, and the first VCO 104a generates the first output signal. The calibration module 116 compares the first count (corresponding to the number of cycles per second of the first output signal) with the second count (corresponding to the number of cycles per second of the target frequency) to determine whether the frequency of the first output signal is greater than, equal to, or less than the target frequency. In case the frequency of the first output signal is less than the target frequency, the calibration module 116 decreases the initial coarse code value "31" by a first defined value, for example, "1". The calibration module 116 generates an updated first set of coarse calibration bits (corresponding to the decreased coarse code value i.e., "30"), and provides the updated first set of coarse calibration bits to the coarse DAC of the first VCO 104a for calibrating the first VCO 104a. The coarse calibration continues until the frequency of the first output signal is greater than or equal to the target frequency.

In case the frequency of the first output signal is greater than the target frequency, the calibration module 116 generates and provides the first set of fine calibration bits (corresponding to an initial value of a fine code that is set to a minimum fine code value, for example, "2") to the fine DAC of the first VCO 104a, and the first VCO 104a generates the first output signal according to the third set of fine calibration bits. The calibration module 116 compares the first count with the second count to determine whether the frequency of the first output signal is greater than, equal to, or less than the target frequency. In case the frequency of the first output signal is greater than the target frequency, the calibration module 116 increases the initial fine code value "2" by a second defined value, for example, "1". The calibration module 116 generates an updated first set of fine calibration bits (corresponding to the increased fine code value i.e., "3"), and provides the updated first set of fine calibration bits to the fine DAC of the first VCO 104a to calibrate the first VCO 104a. The fine calibration continues until the frequency of the first output signal i.e., the VCO output signal is equal to (or approximately equal to) the target frequency. Thus, by performing coarse and fine calibration of the first VCO 104a as described above, the first VCO 104a generates the VCO output signal having the frequency equal to or very close to the target frequency when the target frequency is in the first frequency range. Similarly, the second VCO 104b may be calibrated to generate the VCO output signal (i.e., the second output signal) having the frequency equal to the target frequency when the target frequency is in the second frequency range.

Referring now to FIG. 2, a schematic block diagram of a single VCO 200 of the VCO module 101 of FIG. 1 in accordance with an embodiment of the present invention is shown. The single VCO 200 (hereinafter, the VCO 200) may be one of the first and second VCOs 104a and 104b. The VCO 200 is connected to a current control module 202, as shown. The VCO 200 is a differential VCO that includes an inductor 204, first and second variable capacitors 206 and 208, and a pair of cross-coupled amplifiers including first and second amplifiers 210 and 212. The VCO 200 further includes a pair of coarse DACs 214a and 214b, a pair of fine DACs 216a and 216b, and an array of switches 218.

The first and second variable capacitors 206 and 208 are connected in a series combination between a first node N1 and a second node N2. The inductor 204 is connected in parallel with the first and second variable capacitors 206 and 208 between the first node N1 and the second node N2. The inductor 204 is further coupled with the current control module 202 for receiving a tank current (ITANK). The first and second amplifiers 210 and 212 are connected in a cross-coupled manner between the first node N1 and the second node N2, as shown. In an exemplary scenario, each of the first and second amplifiers 210 and 212 may be implemented by means of an insulated-gate bipolar transistor (IGBT). In such a case, a gate terminal of the first amplifier 210 is connected with a collector terminal of the second amplifier 212 at the second node N2. Similarly, a gate terminal of the second amplifier 212 is connected with a collector terminal of the first amplifier 210 at the first node N1. Further, an emitter terminal of each of the first and second amplifiers 210 and 212 is connected to a ground terminal G, as shown. The first and second coarse DACs 214a and 214b are connected to the calibration module 116 (not shown in FIG. 2) by means of a 4-bit bus architecture (CC<3:0>) for receiving a set of coarse calibration bits. In an exemplary scenario, the set of coarse calibration bits may correspond to the first set of coarse calibration bits when the target frequency is in the first frequency range. In another exemplary scenario, the set of coarse calibration bits may correspond to the second set of coarse calibration bits when the target frequency is in the second frequency range. In yet another exemplary scenario, the set of coarse calibration bits may correspond to the third set of coarse calibration bits when the target frequency is below the first frequency range. The first and second coarse DACs 214a and 214b are further connected to the first node N1 and the second node N2, respectively, and provide the set of coarse calibration bits for calibrating at least one of the inductor 204 and the first and second variable capacitors 206 and 208 to achieve the target frequency. The first and second coarse DACs 214a and 214b are further connected to the array of switches 218 by means of a 4-bit bus architecture (VBOT CC<3:0>), and control operations of switches in the array of switches 218 for executing the coarse calibration. Similarly, the first and second fine DACs 216a and 216b are connected to the calibration module 116 (not shown in FIG. 2) by means of an 8-bit bus architecture (FC<7:0>) for receiving a set of fine calibration bits. In an exemplary scenario, the set of fine calibration bits may correspond to the first set of fine calibration bits when the target frequency is in the first frequency range. In another exemplary scenario, the set of fine calibration bits may correspond to the second set of fine calibration bits when the target frequency is in the second frequency range. In yet another exemplary scenario, the set of fine calibration bits may correspond to the third set of fine calibration bits when the target frequency is below the first frequency range. The first and second fine DACs 216a and 216b are further connected to the first node N1 and the second node N2, respectively, and provide the set of fine calibration bits for calibrating at least one of the inductor 204 and the first and second variable capacitors 206 and 208 to achieve the target frequency. The first and second fine DACs 216a and 216b are further connected to the array of switches 218 by means of an 8-bit bus architecture (VBOT_FC<7:0>), and control operations of the switches in the array of switches 218 for executing the fine calibration.

During the operation of the VCO 200, various types of losses including resistive losses, inductive losses, capacitive losses, switching losses, and the like may occur, thereby increasing the burden on the VCO 200 and degrading the overall performance of the VCO 200. In order to reduce the effect of these losses, the current control module 202 provides the tank current (ITANK) to an LC tank of the VCO 200. The LC tank includes at least the inductor 204 and the first and second variable capacitors 206 and 208. By increasing the tank current (ITANK) through the LC tank, the current control module 202 controls first and second conductance of the first and second amplifiers 210 and 212, respectively. Due to an increase in the first and second conductance, the overall losses in the VCO 200 are minimized, which avoids degradation of conductance at higher temperatures and ensures smooth, continuous, and efficient oscillation of the VCO 200.

Figure 3:
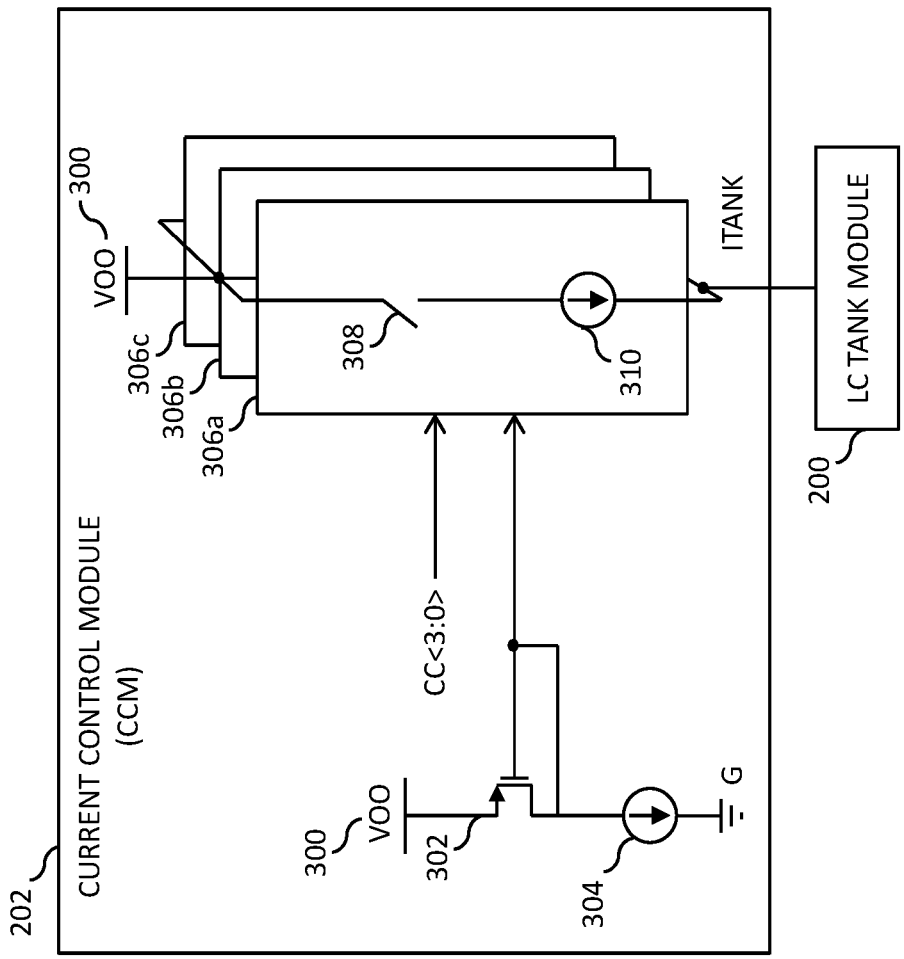
FIG. 3 is a schematic block diagram of the current control module of FIG. 2, in accordance with an embodiment of the present invention.

Referring now to FIG. 3, a schematic block diagram of the current control module 202 of FIG. 2 in accordance with an embodiment of the present invention is shown. The current control module 202 is connected to the VCO 200 and provides the tank current (ITANK) for maintaining the oscillation, as described above in conjunction with FIG. 2. In some embodiments, the current control module 202 is shared by multiple VCOs, e.g., VCO 104a and VCO 104b, and the current control module 202 provides the tank current to the VCO that is active at a given time. The current control module 202 includes a voltage source (VOO) 300, a transistor 302, a first current source 304, and a current DAC module including a plurality of current DACs, such as first, second, and third current DACs 306a, 306b, and 306c. The VOO 300 is connected to the transistor 302, as shown. In an exemplary embodiment, the transistor 302 may be an insulated-gate bipolar transistor (IGBT), such that an emitter terminal of the IGBT is connected to the VOO 300, a collector terminal of the IGBT is connected to the first current source 304, and a gate terminal of the IGBT is connected to the current DAC module. Each of the first, second, and third current DACs 306a, 306b, and 306c includes a switching circuit 308 and a second current source 310, such that the switching circuit 308 is connected in series with the second current source 310. Further, the switching circuit 308 and the second current source 310 of each of the first, second, and third current DACs 306a, 306b, and 306c are in a parallel combination, such that an input terminal of the parallel combination is connected to the VOO 300 and an output terminal of the parallel combination is connected to the VCO 200 for providing the tank current (ITANK). Each of the first, second, and third current DACs 306a, 306b, and 306c is further connected to the calibration module 116 (not shown in FIG. 3) by way of a 4-bit bus architecture for receiving the set of coarse calibration bits. Based on a biasing current from the transistor 302 and the set of coarse calibration bits from the calibration module 116, each of the first, second, and third current DACs 306a, 306b, and 306c generates a DAC current. The DAC currents of the first, second, and third current DACs 306a, 306b, and 306c are combined at the output terminal of the parallel combination to generate the tank current (ITANK) that is provided to the VCO 200. Thus, by increasing the tank current (ITANK) through the VCO 200 based on the set of coarse calibration bits, the first and second conductance of the first and second amplifiers 210 and 212 is increased, thereby, reducing the overall losses in the VCO 200.

Figure 4:
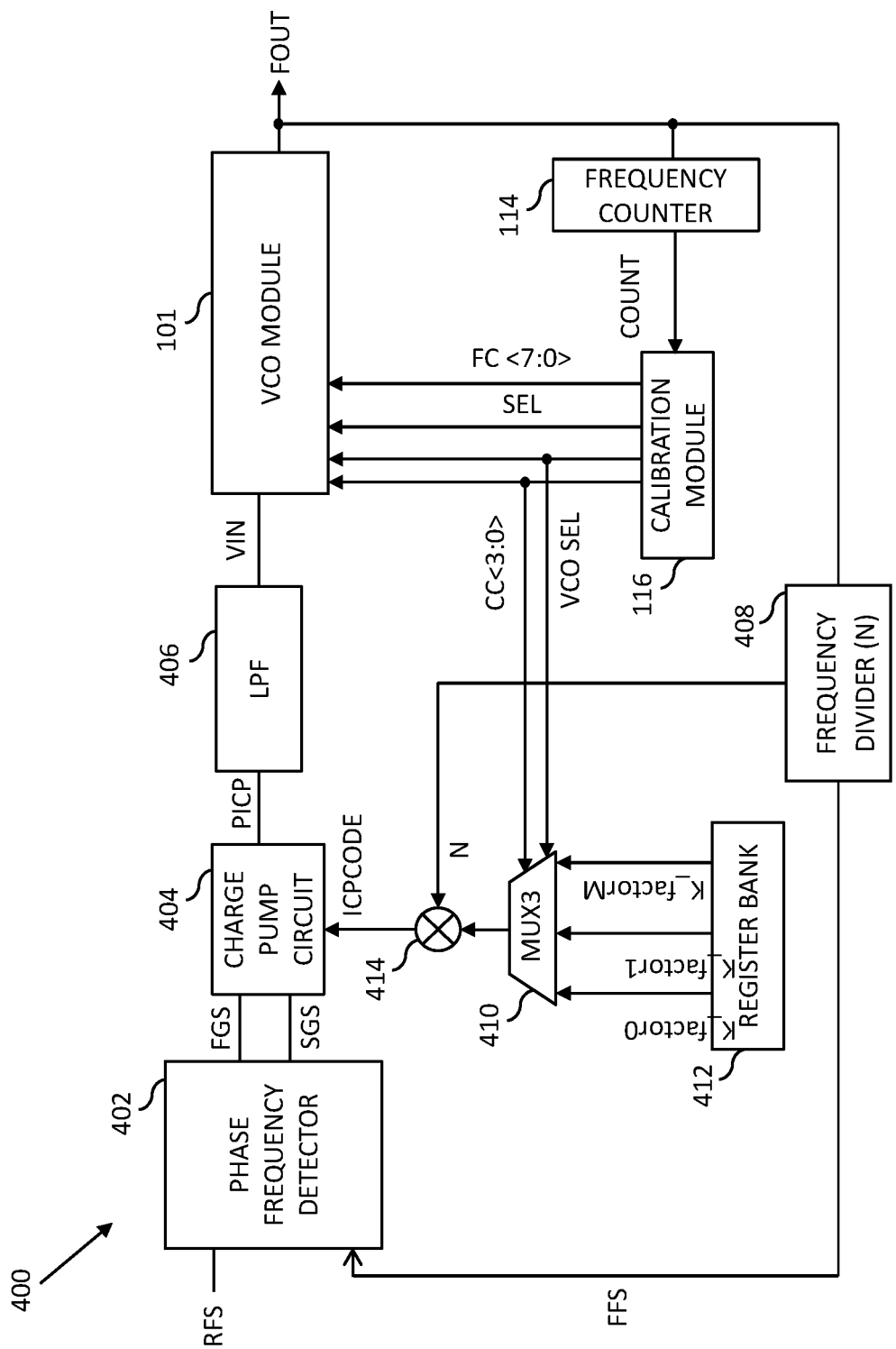
FIG. 4 is a schematic block diagram of a phase-locked loop (PLL) for generating an output signal at a target frequency, in accordance with an embodiment of the present invention.

Referring now to FIG. 4, a schematic block diagram of a PLL 400 for generating an output signal at the target frequency, in accordance with an embodiment of the present invention. The PLL 400 includes a phase frequency detector (PFD) 402, a charge pump circuit (CPC) 404, a low pass filter (LPF) 406, the VCO module 101, the frequency counter 114, the calibration module 116, a second frequency divider 408, a third multiplexer 410, a register bank 412, and a multiplier 414.

The PFD 402 detects phase and frequency of input signals and generates gating signals based on a difference between the phase and frequency of the input signals. The PFD 402 is connected to a reference frequency source (not shown) for receiving a reference frequency signal (RFS) and the second frequency divider 408 for receiving a feedback frequency signal (FFS) and generates first and second gating signals (FGS and SGS). The PFD 402 generates the first and second gating signals (FGS and SGS) based on a difference between at least one of the phase and frequency of the reference frequency signal (RFS) and the feedback frequency signal (FFS). The PFD 402 is connected to the CPC 404.

The CPC 404 receives the first and second gating signals (FGS and SGS) from the PFD 402. The CPC 404 further receives a charge pump current code (ICPCODE) from the multiplier 414. The CPC 404 generates a charge pump current (ICP). Thereafter, the CPC 404 generates a programmable charge pump current (PICP). The magnitude of the programmable charge pump current (PICP) may be modified by programming the charge pump current (ICP) using the charge pump current code (ICPCODE). For example, the magnitude of the programmable charge pump current (PICP) may be determined by way of equation (1) below:

$$\text{Programmable charge pump current(PICP)} = \text{ICP*ICPCODE} \tag{1}$$

The CPC 404 is connected to the LPF 406. The LPF 406 receives the programmable charge pump current (PICP) from the CPC 404. The LPF 406 performs signal conditioning by eliminating noise components from the programmable charge pump current (PICP). The LPF 406 generates a voltage signal that is provided as input to the VCO module 101, hereinafter, referred to as the input voltage signal (VIN).

The operation of the VCO module 101, the frequency counter 114, and calibration module 116 have been described above in conjunction with FIG. 1. The calibration module 116 provides one of the first, second, and third sets of coarse and fine calibration bits to one of the first and second VCOs 104a and 104b for calibrating the frequency of the VCO output signal with the target frequency. The calibration module 116 is further connected to the third multiplexer 410 for providing the VCO select signal (VCO SEL) and one of the first, second, and third sets of coarse calibration bits.

The second frequency divider 408 is connected to the output terminal of the VCO module 101 for receiving the VCO output signal. The second frequency divider 408 divides the frequency of the VCO output signal by a second division factor (N) to generate the feedback frequency signal (FFS) that is provided as an input to the PFD 402. The second frequency divider 408 further provides the second division factor (N) as an input to the multiplier 414.

The third multiplexer 410 has input terminals connected to the register bank 412 for receiving a plurality of gain factors, for example, K_factor0 through K_factorM, where M is an integer value. The register bank 412 stores a look-up table (LUT) that includes the plurality of gain factors. The third multiplexer 410 has a select terminal for receiving the VCO select signal (VCO SEL) and a coarse code terminal for receiving one of the first, second, and third sets of coarse calibration bits provided by the calibration module 116. The third multiplexer 410 further has an output terminal for outputting one of the plurality of gain factors based on the VCO select signal and the first, second, and third sets of coarse calibration bits. The third multiplexer 410 is further connected to the multiplier 414 for providing one of the plurality of gain factors.

The multiplier 414 is connected to the output terminal of the third multiplexer 410 for receiving one of the plurality of gain factors. The multiplier 414 is further connected to the CPC 404 for providing the charge pump current code (ICPCODE). The multiplier 414 may generate the charge pump current code (ICPCODE) based on at least the second division factor (N) and one of the plurality of gain factors provided by the third multiplexer 410. For example, the charge pump current code (ICPCODE) may be determined by way of equation (2) below:

$$\text{ICPCODE} = K\_\text{factor}(n) * N/(\text{ICP/FBDIV})_{desired} \tag{2}$$

where, n=the coarse code of the VCO (selected from one of the first and second VCOs 104a and 104b); and
ICP/FBDIV$_{desired}$=a defined ratio that is chosen to obtain a defined constant bandwidth.

Hence, the variations in gain factors of the first and second VCOs 104a and 104b are controlled based on the charge pump current code (ICPCODE). By providing the VCO select signal (VCO SEL) and the coarse calibration bits, the calibration module 116 calibrates the generation of the charge pump current code (ICPCODE) such that a constant loop bandwidth over a wide frequency range for the PLL 400 may be obtained. The constant loop bandwidth over a wide FLR is used to maintain the stability of the PLL 400 and is preferred in the low jitter applications.

Figure 5A:
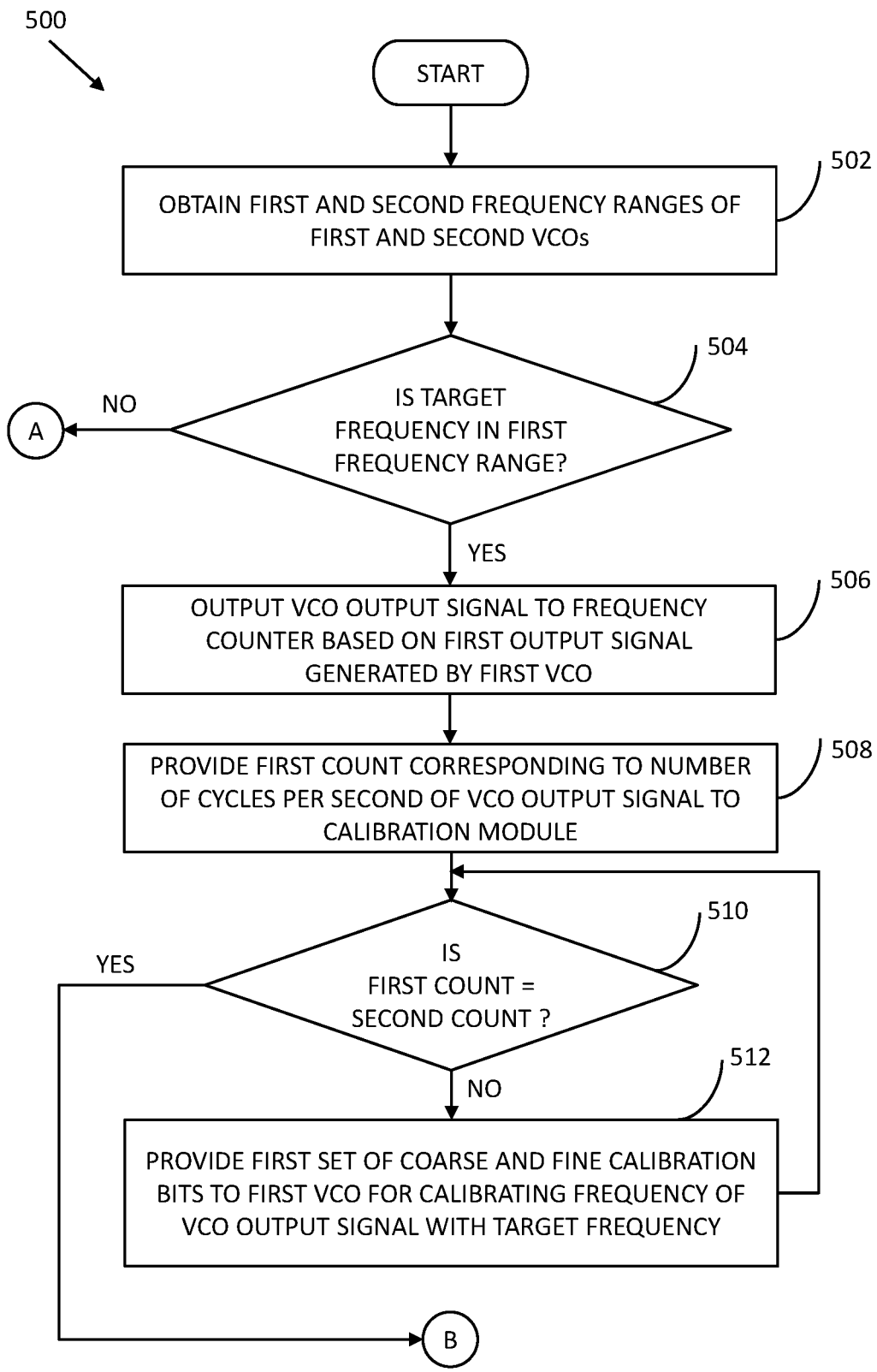
FIGS. 5A, 5B, and 5C are a flowchart illustrating a method for generating a VCO output signal at a target frequency, in accordance with an embodiment of the present invention.
Figure 5B:
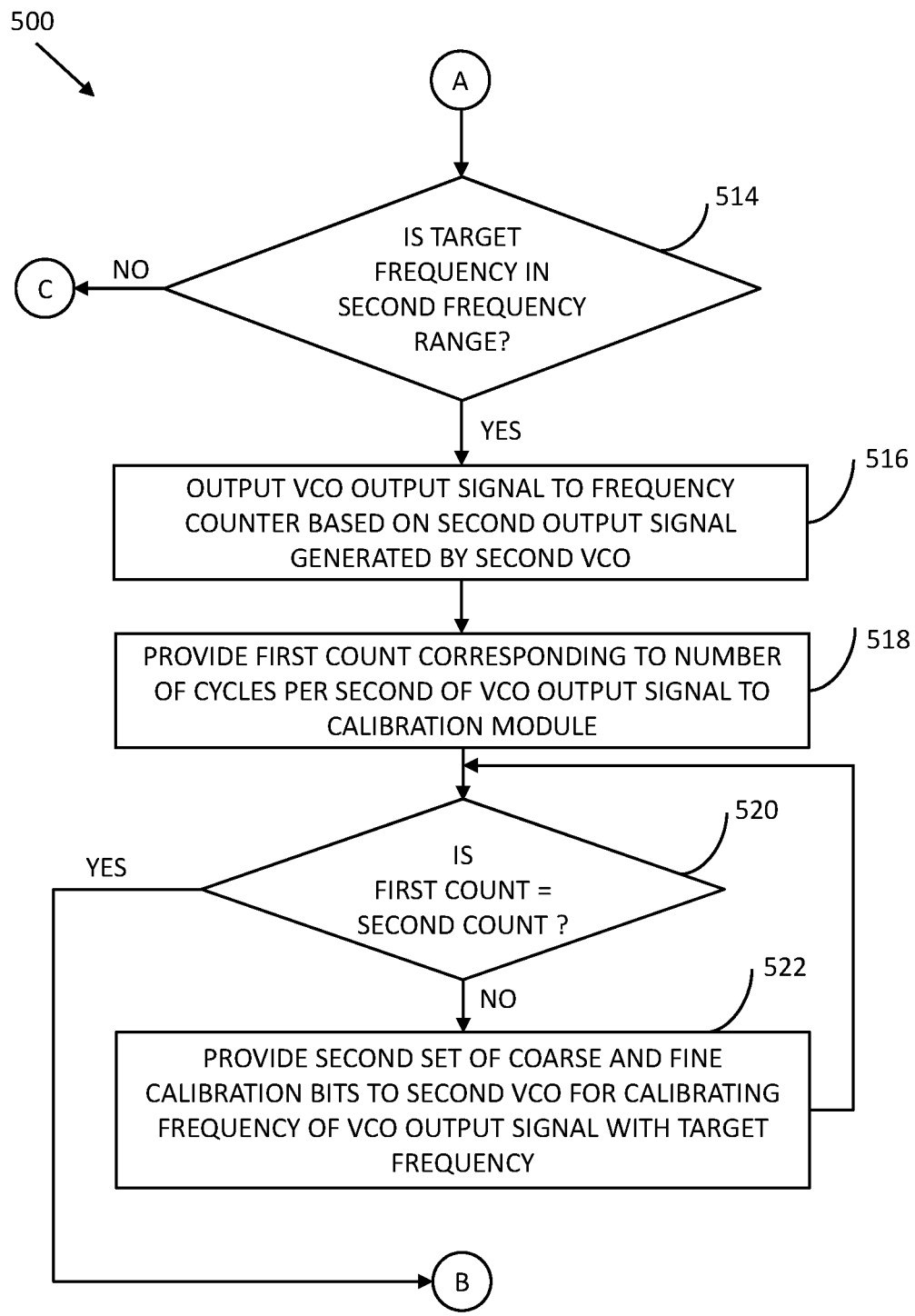
Figure 5C:
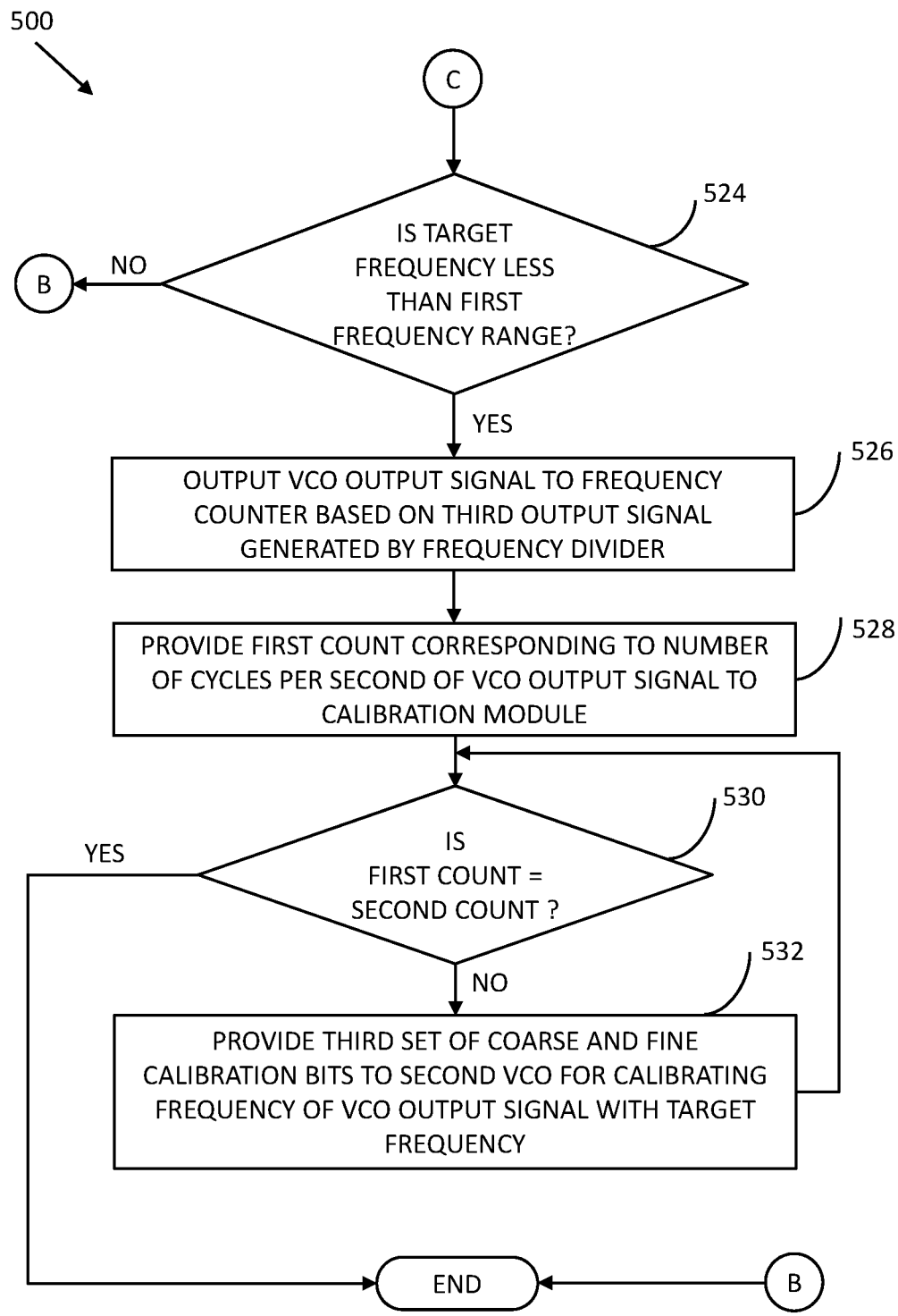

Referring now to FIGS. 5A, 5B, and 5C, a flowchart 500 illustrating a method for generating the VCO output signal at the target frequency in accordance with an embodiment of the present invention is shown.

At step 502, the first and second frequency ranges of the first and second VCOs 104a and 104b are obtained. The calibration module 116 may obtain the first and second frequency ranges from the first and second VCOs 104a and 104b. In another scenario, the calibration module 116 may include a memory (not shown) that stores pre-defined values of the first and second frequency ranges. In one exemplary embodiment, the first VCO 104a may correspond to the low-frequency LCVCO having the first frequency range (e.g., 2.7 GHz-3.7 GHz) and the second VCO 104b may correspond to the medium-frequency LCVCO having the second frequency range (e.g., 3.7 GHz-4.7 GHz). In another exemplary embodiment, the first VCO 104a may correspond to the medium-frequency LCVCO having the first frequency range (e.g., 3.7 GHz-4.7 GHz) and the second VCO 104b may correspond to the high-frequency LCVCO having the second frequency range (e.g., 4.7 GHz-5.7 GHz). In yet another exemplary embodiment, the first VCO 104a may correspond to the low-frequency LCVCO having the first frequency range (e.g., 2.7 GHz-3.7 GHz) and the second VCO 104b may correspond to the high-frequency LCVCO having the second frequency range (e.g., 4.7 GHz-5.7 GHz).

At step 504, a check is performed to determine whether the target frequency is within the first frequency range. The calibration module 116 may compare the target frequency with the first frequency range to perform the check. If at step 504, it is determined that the target frequency is within the first frequency range, then step 506 is performed. However, if at step 504, it is determined that the target frequency is outside the first frequency range, then step 514 is performed.

At step 506, the VCO output signal is outputted to the frequency counter 114 based on the first output signal generated by the first VCO 104a. The second multiplexer 112 provides the first output signal as the VCO output signal to the frequency counter 114 when the target frequency is in the first frequency range.

At step 508, the first count corresponding to the number of cycles per second of the VCO output signal is provided to the calibration module 116. The frequency counter 114 generates and provides the first count to the calibration module 116.

At step 510, a check is performed to determine whether the first count is equal to the second count corresponding to the number of cycles per second of the target frequency. The calibration module 116 may compare the first count with the second count to perform the check. If at step 510, it is determined that the first count is equal to the second count (i.e., the frequency of the VCO output signal matches the target frequency), then the process ends. However, if at step 510, it is determined that the first count is not equal to the second count, then step 512 is performed.

At step 512, the first set of coarse and fine calibration bits are provided to the first VCO 104*a*. The calibration module 116 generates and provides the first set of coarse and fine calibration bits to the first VCO 104*a*, by means of the coarse and fine DACs (e.g., the coarse DACs 214*a* and 214*b*, and the fine DACs 216*a* and 216*b*, shown in FIG. 2), for calibrating the frequency of the VCO output signal with the target frequency. The first VCO 104*a* performs coarse and fine calibration of the first output signal based on the first set of coarse and fine calibration bits, respectively. During coarse calibration, when the first count is less than the second count, the calibration module 116 generates the first set of coarse calibration bits based on a previous coarse code value (for example, "31") and the first defined value (for example, "1"). In an exemplary embodiment, the calibration module 116 subtracts the first defined value from the previous coarse code value and generates the first set of coarse calibration bits that is used for performing coarse calibration of the first VCO 104*a*. In another exemplary embodiment, during the process of coarse calibration, when the first count is more than the second count, the calibration module 116 adds the first defined value to the previous coarse code value and generates the first set of coarse calibration bits that is used for performing the coarse calibration of the first VCO 104*a*. Similarly, during the process of fine calibration, when the first count is more than the second count, the calibration module 116 adds the second defined value (for example, "1") to a previous fine code value and generates the first set of fine calibration bits that is used for performing fine calibration of the first VCO 104*a*. In another exemplary embodiment, during the process of fine calibration, when the first count is less than the second count, the calibration module 116 subtracts the second defined value from the previous fine code value and generates the first set of fine calibration bits that is used for performing fine calibration of the first VCO 104*a*. The coarse and fine calibration is performed until the first count becomes equal to the second count.

At step 514, a check is performed to determine whether the target frequency is within the second frequency range. The calibration module 116 may compare the target frequency with the second frequency range to perform the check. If at step 514, it is determined that the target frequency is within the second frequency range, then step 516 is performed. However, if at step 514, it is determined that the target frequency is outside the second frequency range, then step 524 is performed.

At step 516, the VCO output signal is outputted to the frequency counter 114 based on the second output signal generated by the second VCO 104*b*. The second multiplexer 112 provides the second output signal as the VCO output signal to the frequency counter 114 when the target frequency is within the second frequency range.

At step 518, the first count corresponding to the number of cycles per second of the VCO output signal is provided to the calibration module 116. The frequency counter 114 generates and provides the first count to calibration module 116.

At step 520, a check is performed to determine whether the first count is equal to the second count corresponding to the number of cycles per second of the target frequency. The calibration module 116 may compare the first count with the second count to perform the check. If at step 520, it is determined that the first count is equal to the second count (i.e., the frequency of the VCO output signal matches the target frequency), then the process ends. However, if at step 520, it is determined that the first count is not equal to the second count, then step 522 is performed.

At step 522, the second set of coarse and fine calibration bits are provided to the second VCO 104*b*. The calibration module 116 generates and provides the second set of coarse and fine calibration bits to the second VCO 104*b*, by means of the coarse and fine DACs (e.g., the coarse DACs 214*a* and 214*b*, and the fine DACs 216*a* and 216*b*, shown in FIG. 2), for calibrating the frequency of the VCO output signal with the target frequency. The second VCO 104*b* performs coarse and fine calibration of the second output signal based on the second set of coarse and fine calibration bits, respectively. During coarse calibration, when the first count is less than the second count, the calibration module 116 generates the second set of coarse calibration bits based on a previous coarse code value (for example, "31") and the first defined value (for example, "1"). In an exemplary embodiment, the calibration module 116 subtracts the first defined value from the previous coarse code value and generates the second set of coarse calibration bits that is used for performing the coarse calibration of the second VCO 104*b*. In another exemplary embodiment, during the process of coarse calibration, when the first count is more than the second count, the calibration module 116 adds the first defined value to the previous coarse code value and generates the second set of coarse calibration bits that is used for performing the coarse calibration of the second VCO 104*b*. Similarly, during the process of fine calibration, when the first count is more than the second count, the calibration module 116 adds the second defined value (for example, "1") to a previous fine code value and generates the second set of fine calibration bits that is used for performing fine calibration of the second VCO 104*b*. In another exemplary embodiment, during the process of fine calibration, when the first count is less than the second count, the calibration module 116 subtracts the second defined value from the previous fine code value and generates the second set of fine calibration bits that is used for performing fine calibration of the second VCO 104*b*. The coarse and fine calibration is performed continuously until the first count becomes equal to the second count.

At step 524, a check is performed to determine whether the target frequency is below the first frequency range. The calibration module 116 may compare the target frequency with the first frequency range to perform the check. If at step 524, it is determined that the target frequency is less the first frequency range, then step 526 is performed. However, if at step 524, it is determined that the target frequency is not below the first frequency range, then the process ends.

At step 526, the VCO output signal is outputted to the frequency counter 114 based on the third output signal generated by the first frequency divider 110. The second multiplexer 112 provides the third output signal as the VCO output signal to the frequency counter 114 when the target frequency is below the first frequency range.

At step 528, the first count corresponding to the number of cycles per second of the VCO output signal is provided to the calibration module 116. The frequency counter 114 generates and provides the first count to calibration module 116.

At step 530, a check is performed to determine whether the first count is equal to the second count corresponding to the number of cycles per second of the target frequency. The calibration module 116 may compare the first count with the second count to perform the check. If at step 530, it is determined that the first count is equal to the second count (i.e., the frequency of the VCO output signal matches the target frequency), then the process ends. However, if at step 530, it is determined that the first count is not equal to the second count, then step 532 is performed.

At step 532, the third set of coarse and fine calibration bits are provided to the second VCO 104b. The calibration module 116 generates and provides the third set of coarse and fine calibration bits to the second VCO 104b, by means of the coarse and fine DACs (e.g., the coarse DACs 214a and 214b, and the fine DACs 216a and 216b, shown in FIG. 2), for calibrating the frequency of the VCO output signal with the target frequency. The second VCO 104b performs coarse and fine calibration of the second output signal based on the third set of coarse and fine calibration bits, respectively. During the process of coarse calibration, when the first count is less than the second count, the calibration module 116 generates the third set of coarse calibration bits based on a previous coarse code value (for example, "31") and the first defined value (for example, "1"). In an exemplary embodiment, the calibration module 116 subtracts the first defined value from the previous coarse code value and generates the third set of coarse calibration bits that is used for performing coarse calibration of the second VCO 104b. In another exemplary embodiment, during the process of coarse calibration when the first count is more than the second count, the calibration module 116 adds the first defined value to the previous coarse code value and generates the third set of coarse calibration bits that is used for performing coarse calibration of the second VCO 104b. Similarly, during the process of fine calibration, when the first count is more than the second count, the calibration module 116 adds the second defined value (for example, "1") to a previous fine code value and generates the third set of fine calibration bits that is used for performing fine calibration of the second VCO 104b. In another exemplary embodiment, during the process of fine calibration, when the first count is less than the second count, the calibration module 116 subtracts the second defined value from the previous fine code value and generates the third set of fine calibration bits that is used for performing fine calibration of the second VCO 104b. The coarse and fine calibration is performed continuously until the first count becomes equal to the second count.

In an embodiment, the automatic calibration of the VCOs generates and provides a frequency locking range (FLR) of 2:1 (i.e., a ratio of the maximum to minimum frequency is 2:1) despite variation in process, voltage, and temperature (PVT) of the PLL 400. Furthermore, the multiple VCOs achieve the 2:1 FLR without putting an extra effort on the design of the VCOs. Thus, when the target frequency is below the first and second frequency ranges, the second VCO 104b having the second frequency range (greater than the first frequency range) is calibrated to obtain a third frequency range (less than the first frequency range) that may be utilized for various low jitter applications. Thus, the PLL 400 provides a wide range of frequencies without compromising on the design of the VCOs. Furthermore, variations in gain factor of the VCOs are controlled by programming the charge pump current (ICP), and thereby, obtaining a constant loop bandwidth over a wide FLR.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention.

What is claimed is:

1. A phase-locked loop (PLL) for generating a voltage controlled oscillator (VCO) output signal at a target frequency, comprising:
    a first VCO and a second VCO configured to generate a first output signal and a second output signal over a first frequency range and a second frequency range, respectively;
    a first multiplexer configured to receive the first output signal from the first VCO, receive the second output signal from the second VCO, and output one of the first output signal or the second output signal, wherein the first multiplexer outputs the first output signal in response to the target frequency being in the first frequency range, and outputs the second output signal in response to the target frequency being in the second frequency range or below the first frequency range;
    a frequency divider configured to receive the second output signal in response to the target frequency being below the first frequency range, and divide a frequency of the second output signal by a division factor to generate a third output signal; and
    a second multiplexer configured to receive the one of the first output signal and the second output signal from the first multiplexer, receive the third output signal from the frequency divider, and output, as the VCO output signal, one of the first output signal, second output signal, or third output signal based on the target frequency, wherein the second multiplexer outputs the first output signal in response to the target frequency being in the first frequency range, outputs the second output signal in response to the target frequency being in the second frequency range, and outputs the third output signal in response to the target frequency being below the first frequency range.

2. The PLL of claim 1, further comprising a calibration module connected to the first multiplexer and the second multiplexer, wherein the calibration module is configured to provides a VCO SEL signal to the first multiplexer to select the one of the first output signal or the second output signal based on the target frequency, and to provide the SEL signal to the second multiplexer to select the one of the first output signal, second output signal, or third output signal.

3. The PLL of claim 2, wherein the calibration module is further connected to the first VCO, wherein the calibration module is configured to provide a first set of coarse and fine calibration bits to the first VCO for calibrating a frequency of the VCO output signal with the target frequency in response to the target frequency being in the first frequency range.

4. The PLL of claim 3, wherein the calibration module is further connected to the second VCO, wherein the calibration module is further configured to provide a second set of coarse and fine calibration bits to the second VCO for calibrating the frequency of the VCO output signal with the target frequency in response to the target frequency being in the second frequency range.

5. The PLL of claim 4, wherein the calibration module is further configured to provide a third set of coarse and fine calibration bits to the second VCO for calibrating the frequency of the VCO output signal with the target frequency in response to the target frequency being less than the first frequency range.

6. The PLL of claim 2, further comprising a frequency counter, connected to the second multiplexer and the calibration module, wherein the frequency counter is configured to receive the VCO output signal from the second multiplexer and provide a first count to the calibration module, the first count corresponding to a number of cycles per second of the VCO output signal.

7. The PLL of claim 6, wherein the calibration module is configured to compare the first count with a second count corresponding to a number of cycles per second of the target frequency and generate the VCO SEL signal that is provided to the first multiplexer.

8. The PLL of claim 2, further comprising a current control module that is connected to at least one of the first VCO and the second VCO, the current control module is configured to provide a tank current to an inductive-capacitive (LC) tank of the at least one of the first VCO and the second VCO.

9. The PLL of claim 8, wherein the current control module is further configured to control first and second conductance of first and second amplifiers, respectively, of a cross-coupled pair of amplifiers of the at least one of the first VCO and the second VCO, by increasing the tank current through the LC tank.

10. The PLL of claim 2, further comprising a third multiplexer connected to a register bank that stores a look-up table (LUT) of a plurality of gain factors, the third multiplexer configured to receive the VCO SEL signal and a set of coarse calibration bits from the calibration module, and to output a gain factor of the plurality of gain factors based on the VCO SEL signal and the set of course calibration bits.

11. The PLL of claim 10, further comprising a multiplier configured to receive the gain factor from the third multiplexer and a second division factor from a second frequency divider, wherein the multiplier is configured to provide a charge pump current code to a charge pump of the PLL based on the gain factor and the second division factor.

12. The PLL of claim 2, wherein the calibration module comprises a processor that implements a digital fixed-state machine (FSM).

13. The PLL of claim 1, wherein a frequency locking range of the frequency of the VCO output signal is 1:2.

14. The PLL of claim 1, wherein the first VCO comprises a low-frequency, inductive-capacitive VCO (LCVCO) and the second VCO comprises a high-frequency LCVCO.

15. The PLL of claim 14, wherein the first frequency range is less than the second frequency range.

16. A method for generating a voltage controlled oscillator (VCO) output signal at a target frequency comprising:
generating a first output signal over a first frequency range by a first VCO and a second output signal over a second frequency ranges by a second VCOs;
comparing the target frequency to the first frequency range and the second frequency range;
selecting, by a first multiplexer, one of the first output signal or the second output signal, wherein the first output signal is selected in response to the target frequency being in the first frequency range, and the second output signal is selected in response to the target frequency being in the second frequency range or below the first frequency range;
dividing, by a frequency divider, a frequency of the second output signal by a division factor to generate a third output signal in response to the target frequency being below the first frequency range; and
outputting, by a second multiplexer, one of the first output signal, second output signal, or third output signal as the VCO output signal, based on the target frequency, wherein the second multiplexer outputs the first output signal in response to the target frequency being in the first frequency range, outputs the second output signal in response to the target frequency being in the second frequency range, and outputs the third output signal in response to the target frequency being below the first frequency range.

17. The method of claim 16, further comprising:
generating, by a calibration module, a first set of coarse and fine calibration bits in response to the target frequency being in the first frequency range; and
providing, by the calibration module, the first set of coarse and fine calibration bits to the first VCO for calibrating a frequency of the VCO output signal with the target frequency.

18. The method of claim 17, further comprising:
generating, by the calibration module, a second set of coarse and fine calibration bits in response to the target frequency being in the second frequency range; and
providing, by the calibration module, the second set of coarse and fine calibration bits to the second VCO for calibrating the frequency of the VCO output signal with the target frequency.

19. The method of claim 18, further comprising:
generating, by the calibration module, a third set of coarse and fine calibration bits in response to the target frequency being below the first frequency range; and
providing, by the calibration module, the third set of coarse and fine calibration bits to the second VCO for calibrating the frequency of the VCO output signal with the target frequency.

20. The method of claim 16, wherein the first VCO comprises a low-frequency, inductive-capacitive VCO (LCVCO) and the second VCO comprises a high-frequency LCVCO, and wherein the first frequency range is less than the second frequency range.

* * * * *

UNITED STATES PATENT AND TRADEMARK OFFICE
CERTIFICATE OF CORRECTION

PATENT NO. : 10,715,158 B1  
APPLICATION NO. : 16/424365  
DATED : July 14, 2020  
INVENTOR(S) : Akarsh Joshi et al.

Page 1 of 1

It is certified that error appears in the above-identified patent and that said Letters Patent is hereby corrected as shown below:

In the Claims

Column 18, Claim 2, Line 43, delete "provides a VCO SEL" and insert --provide a VCO SEL--.

Column 19, Claim 16, Line 53, delete "frequency ranges by a second VCOs" and insert --frequency range by a second VCO--.

Signed and Sealed this  
Twelfth Day of January, 2021

Andrei Iancu  
*Director of the United States Patent and Trademark Office*